(12) United States Patent
Smarsly et al.

(10) Patent No.: US 10,465,264 B2
(45) Date of Patent: Nov. 5, 2019

(54) AL-RICH HIGH-TEMPERATURE TIAL ALLOY

(71) Applicant: MTU Aero Engines AG, Munich (DE)

(72) Inventors: Wilfried Smarsly, Munich (DE); Martin Schloffer, Munich (DE); Helmut Clemens, Leoben (AT); Svea Mayer, Trieben (AT)

(73) Assignee: MTU AERO ENGINES AG, Munich (DE)

( * ) Notice: Subject to any disclaimer, the term of this patent is extended or adjusted under 35 U.S.C. 154(b) by 886 days.

(21) Appl. No.: 14/797,464

(22) Filed: Jul. 13, 2015

(65) Prior Publication Data

US 2016/0010184 A1 Jan. 14, 2016

(30) Foreign Application Priority Data

Jul. 14, 2014 (EP) .................... 14176860

(51) Int. Cl.
| | |
|---|---|
| *C22C 21/00* | (2006.01) |
| *C22C 14/00* | (2006.01) |
| *C22C 1/02* | (2006.01) |
| *C22C 1/04* | (2006.01) |
| *B22F 5/00* | (2006.01) |
| *B22D 13/00* | (2006.01) |

(Continued)

(52) U.S. Cl.
CPC .............. *C22C 21/00* (2013.01); *B22D 13/00* (2013.01); *B22D 21/04* (2013.01); *B22F 3/15* (2013.01); *B22F 3/16* (2013.01); *B22F 3/17* (2013.01); *B22F 5/009* (2013.01); *B22F 9/04* (2013.01); *C22C 1/026* (2013.01); *C22C 1/0408* (2013.01); *C22C 1/0416* (2013.01); *C22C 1/0458* (2013.01); *C22C 1/0491* (2013.01); *C22C 14/00* (2013.01); *C22C 21/003* (2013.01); *C30B 11/00* (2013.01); *C30B 15/00* (2013.01); *C30B 29/52* (2013.01); *B22F 2009/041* (2013.01)

(58) Field of Classification Search
CPC ........ C22C 1/0416; C22C 21/00; C22C 14/00
USPC .......................................................... 420/418
See application file for complete search history.

(56) References Cited

U.S. PATENT DOCUMENTS

| | | |
|---|---|---|
| 5,284,620 A | 2/1994 | Larsen, Jr. |
| 5,348,594 A | 9/1994 | Hanamura et al. |

(Continued)

FOREIGN PATENT DOCUMENTS

| | | |
|---|---|---|
| EP | 0592189 A1 | 4/1994 |
| JP | H02163333 A | 6/1990 |

(Continued)

OTHER PUBLICATIONS

Massalski: "Binary Alloy Phase Diagrams", Jan. 1, 1987 (Jan. 1, 1987), AMS International, vol. 1, p. 226.

*Primary Examiner* — Weiping Zhu
(74) *Attorney, Agent, or Firm* — Abel Schillinger, LLP

(57) ABSTRACT

The present invention relates to a TiAl alloy for use at high temperatures which has aluminum and titanium as main constituents. The TiAl alloy has an aluminum content of greater than or equal to 50 at. % and a matrix of γ-TiAl and at least one phase of Al and Ti incorporated in the γ-TiAl matrix which is different from γ-TiAl, as well as depositions of oxides and/or carbides and/or silicides. In addition, the invention relates to a method for producing the alloy and to the use of the alloy for components of turbo-machines, in particular aircraft engines.

19 Claims, 1 Drawing Sheet

(51) Int. Cl.
  *B22D 21/04* (2006.01)
  *B22F 3/15* (2006.01)
  *B22F 3/16* (2006.01)
  *B22F 3/17* (2006.01)
  *B22F 9/04* (2006.01)
  *C30B 15/00* (2006.01)
  *C30B 11/00* (2006.01)
  *C30B 29/52* (2006.01)

(56) References Cited

U.S. PATENT DOCUMENTS

| | | | |
|---|---|---|---|
| 5,348,595 A | | 9/1994 | Hanamura et al. |
| 5,429,796 A | | 7/1995 | Larsen, Jr. |
| 5,431,754 A | * | 7/1995 | Fujiwara ................. C22F 1/183 |
| | | | 148/421 |
| 5,980,654 A | * | 11/1999 | Quadakker ............. C22F 1/183 |
| | | | 148/421 |
| 2007/0131054 A1 | * | 6/2007 | Bangaru ................. C22C 29/00 |
| | | | 75/235 |

FOREIGN PATENT DOCUMENTS

| | | |
|---|---|---|
| JP | H02258938 A | 10/1990 |
| JP | H03285051 A | 12/1991 |

\* cited by examiner

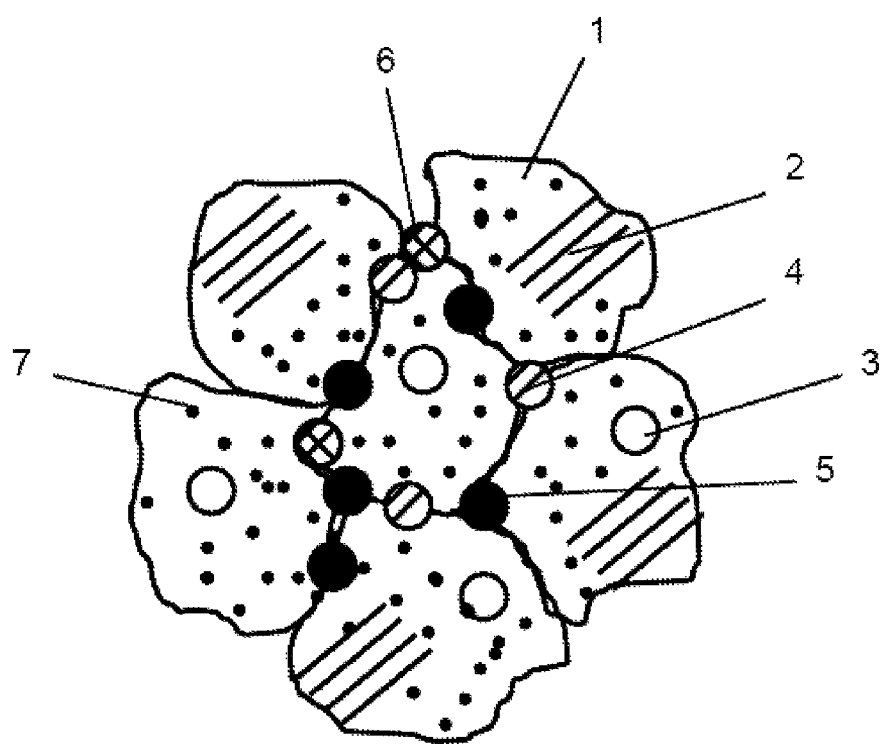

AL-RICH HIGH-TEMPERATURE TIAL ALLOY

CROSS-REFERENCE TO RELATED APPLICATIONS

The present application claims priority under 35 U.S.C. § 119 of European Patent Application No. 14176860.6, filed Jul. 14, 2014, the entire disclosure of which is expressly incorporated by reference herein.

BACKGROUND OF THE INVENTION

1. Field of the Invention The present invention relates to a TiAl alloy for use at high temperatures, in particular in the range of from 750° C. to 950° C., and to the production and use thereof 2. Discussion of Background Information Alloys based on intermetallic titanium aluminide compounds are used in the construction of stationary gas turbines or aircraft engines, for example as a material for rotor blades, because they have the mechanical properties required for use and, in addition, possess a low specific weight, so that the use of such alloys can increase the efficiency of stationary gas turbines and aircraft engines.

A large number of TiAl alloys have accordingly already been developed, there currently being used in particular TiAl alloys based on the intermetallic γ-TiAl phase which are alloyed with niobium and molybdenum or boron and are therefore referred to as TNM or TNB alloys. Such alloys comprise as the main constituent titanium as well as approximately from 40 to 45 at. % aluminum, about 5 at. % niobium and, for example, 1 at. % molybdenum as well as small amounts of boron. The microstructure is characterized by a high γ-TiAl content and likewise significant amounts of $\alpha_2$-$Ti_3Al$, it being possible for further phases, such as, for example, β-phase or B19 phase, to occur in a smaller amount.

The known TNM or TNB alloys based on γ-TiAl usually have a globular, equiaxial γ-TiAl structure, a lamellar structure or a duplex structure with globular, equiaxial γ-TiAl grains and lamellar regions of γ-TiAl and $\alpha_2$-$Ti_3Al$. Although such γ-TiAl alloys, in particular with lamellar microstructures, generally exhibit very good mechanical properties up to 750° C., the mechanical properties are impaired at higher temperatures owing to the thermodynamic instability of the structure, the creep resistance falling in particular. At temperatures above 700° C., oxygen additionally diffuses into the rim zone of the component, resulting in phase instabilities, microstructural changes and embrittlement of the material.

In view of the foregoing, it would be advantageous to have available an alloy which has a low specific weight similar to the known γ-TiAl alloys as well as comparable mechanical properties, in particular at high temperatures, the range of use preferably being enlarged to temperatures in the range of from 750° to 900° C. or 950° C. Such an alloy should be capable of being produced and processed on an industrial scale without an excessive outlay and also of being used reliably in stationary gas turbines and aircraft engines.

SUMMARY OF THE INVENTION

The present invention provides a TiAl alloy, a method for producing a TiAl alloy, and a component comprising the TiAl alloy as set forth in the independent claims. Advantageous embodiments are set forth in the dependent claims.

In the following, a TiAl alloy is understood as being an alloy whose main constituents are titanium and aluminum, so that the content of aluminum and titanium in at. % or % by weight is in each case greater than the corresponding content of any other alloying component. The aluminum content in at. % or % by weight can be greater than the titanium content, even though the name TiAl appears to indicate the opposite. In addition, a TiAl alloy according to the invention is understood as being an alloy that is composed predominantly of intermetallic phases having the constituents titanium and/or aluminum. Intermetallic phases are understood as being phases of the TiAl system which have a high content of covalent bonding forces within the metallic bond and thus have high strength and in particular also high-temperature strength.

According to the invention there is proposed a TiAl alloy which has an aluminum content of 50 at. % or more and is formed with a γ-TiAl matrix. In addition, the microstructure of the TiAl alloy according to the invention has one or more phases of aluminum and titanium incorporated in the matrix which are different from the γ-TiAl phase, as well as depositions of oxides and/or carbides and/or silicides.

By means of the microstructure according to the invention, the required properties of the TiAl alloy in respect of ductility, strength, in particular high-temperature strength, fracture toughness and creep and oxidation resistance up to use temperatures of up to 950° C. can be achieved, the required strength being provided by the depositions in the form of further titanium- and aluminum-containing phases that are incorporated in the γ-TiAl matrix, as well as by oxides, carbides and/or silicides.

The aluminum content of such an alloy can be up to 75 at. %, preferably up to 65 at. %, in particular up to 60 at. %, so that in particular aluminum-rich, intermetallic phases, such as $Al_3Ti$ and $Al_2Ti$, are able to form, which phases are resistant at the high temperatures and in particular are also insensitive to oxidation attacks.

The TiAl alloy can in particular be so adjusted that the γ-TiAl matrix occupies 50 vol. % or more of the microstructure and there forms in particular a closed, globular or a net-like γ-TiAl matrix, so that a continuous ductile structure is present. A closed or net-like matrix is understood as being a form of the γ-TiAl matrix in which there are no or almost no isolated γ-TiAl regions that are completely surrounded by other phases and thus would not exhibit bonding to adjacent regions of the γ-TiAl phase.

In addition to the aluminum-rich, intermetallic phases already mentioned above, such as in particular $Al_3Ti$ and $Al_2Ti$, the microstructure can comprise further phases which are formed substantially of aluminum and titanium, that is to say comprise predominantly those alloying constituents, such as, for example, β-titanium and morphologies of the β-phase such as the $β_0$-phase.

The intermetallic phases present in the γ-TiAl matrix can be in the form of, for example, lamellar depositions, plate-like depositions or globular depositions and can both ensure that the grain boundaries are stabilized and/or that, in the case of fine formation of the depositions, dislocation motion is also impeded. Stabilization of the grain boundaries can reduce or impede grain growth at high temperatures.

The oxide, carbide and/or silicide depositions can be formed by different alloying constituents which will be described hereinbelow.

Zirconium oxide and yttrium oxide, inter alia, can be incorporated in finely dispersed form in the matrix, in order to prevent the movement of dislocations at high temperatures. The oxides can have a mean or maximum particle size of 1 μm or less, in particular particle sizes in the nanometer range, so that the oxides are distributed very finely in the structure.

The oxides incorporated in the γ-TiAl matrix can be introduced into the alloy by mechanical alloying, it being possible to alloy corresponding oxides directly. In addition, it is also possible to alloy oxide formers, such as yttrium or zirconium, finely distributed in metallic form, so that, when the alloy or a component formed therefrom is subjected to heat treatments in the production process, oxygen that is present is able to react with the oxide formers in order to form the oxides distributed in finely dispersed form in the matrix. It is also conceivable for the depositions to be formed only during operation at correspondingly high use temperatures.

Further depositions which can be incorporated in the matrix are carbides, such as, for example, tungsten carbide, chromium carbide or zirconium carbide, it again being possible for carbides that are stable at high temperatures to stabilize the grain boundaries and prevent or reduce grain growth.

The alloy may comprise one or more constituents from the group niobium, molybdenum, tungsten, cobalt, chromium, vanadium, zirconium, silicon, carbon, erbium, gadolinium, hafnium, yttrium, boron.

The addition of silicon, erbium and/or gadolinium can inhibit the diffusion of oxygen into the material, so that the diffusion of oxygen at temperatures above 700° C. which is to be observed with current TiAl alloys can be reduced or avoided so that, independently and in conjunction with the aluminum-rich phases which are insensitive to oxygen attack, destabilization of the structure by oxygen attack in the rim zones of the component can be reduced or prevented.

The alloying constituents may be present in the alloy in the following amounts, in order to be able to establish the above-described, advantageous structure:

| | | |
|---|---|---|
| W | from 0 to 3 at. % | |
| Si | from 0.2 to 0.35 at. % | |
| C | from 0 to 0.6 at. % | |
| Zr | from 0 to 6 at. % | |
| Y | from 0 to 0.5 at. % | |
| Hf | from 0 to 0.3 at. % | |
| Er | from 0 to 0.5 at. % | |
| Gd | from 0 to 0.5 at. % | |
| B | from 0 to 0.2 at. % | |
| and/or | | |
| Nb | from 4 to 25 at. % | and/or |
| Mo | from 1 to 10 at. % | and/or |
| W | from 0.5 to 3.0 at. % | and/or |
| Co | from 0.1 to 10 at. % | and/or |
| Cr | from 0.5 to 3.0 at. % | and/or |
| V | from 0.5 to 10 at. %. | |

The γ-TiAl alloy of the present invention may be produced by melt metallurgy or powder metallurgy, and the two production routes can also be combined with one another, for example by producing by melt metallurgy at least a portion of the material required for production by powder metallurgy and then processing it further with powder of other constituents by powder metallurgy. In particular, at least portions of the alloying constituents can be mechanically alloyed in order, for example, to permit the fine distribution of the oxides (oxide dispersion strengthening).

In particular, the alloy may be melted by arc melting in vacuo or under a protective gas atmosphere.

The cast alloy may be compressed by hot isostatic pressing in order to eliminate pores formed during solidification, for example. Hot isostatic pressing may also be carried out in the case of production by powder metallurgy.

A corresponding alloy may be cast in a near net shape or manufactured in a near net shape by means of powder metallurgical production to form a component for finishing, or the alloy can be formed by forging, in particular isothermal forging, after casting.

The alloy or a component produced from the alloy may be subjected to a one- or multi-step heat treatment in order to establish the corresponding structure with the depositions.

The TiAl alloy may be used in particular for components of turbo-machines, such as, for example, for components of an aircraft engine, in which the operating temperatures can be up to 950° Celsius.

BRIEF DESCRIPTION OF THE DRAWING

The only FIGURE shows, purely schematically, an exemplary embodiment of a structure of a TiAl alloy according to the invention.

DETAILED DESCRIPTION OF EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show details of the present invention in more detail than is necessary for the fundamental understanding of the present invention, the description in combination with the FIGURE making apparent to those of skill in the art how the several forms of the present invention may be embodied in practice.

The FIGURE shows a microstructure of a TiAl alloy according to the invention in a purely schematic representation.

FIG. 1 shows, in a sectional view, globular γ-TiAl grains 1 which form the γ-TiAl matrix. Carbides 4 and silicides 5 as well as oxides 6 are deposited at some of the grain boundaries and stabilize the grain boundaries. Within the γ-TiAl grains, depositions of intermetallic phases, such as $Al_3Ti$ and $Al_2Ti$, are to be seen, which are in the form of globular depositions 3 or in the form of lamellar depositions 2 in the γ-TiAl grains or between the γ-TiAl grains 1.

Oxide particles 7, for example in the form of yttrium oxide or zirconium oxide, which are distributed in finely dispersed form and have a mean or maximum particle size in the range of less than or equal to 1 μm, preferably in the nanometer range, are further incorporated in the γ-TiAl grains.

Such a material offers a balanced property profile with a low specific weight, high mechanical strength, sufficient ductility and good high-temperature behavior, with high creep resistance and good oxidation resistance, in particular for components which are subjected to high mechanical stresses at high temperatures, such as, for example, components of gas turbines or aircraft engines.

Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

LIST OF REFERENCE NUMERALS

1 γ-TiAl grains of the γ-TiAl matrix
2 Lamellar TiAl depositions
3 Globular TiAl depositions
4 Carbides
5 Silicides
6 Oxides
7 Oxides (distributed in finely dispersed form)

What is claimed is:

1. A TiAl alloy for use at high temperatures, wherein the alloy comprises aluminum and titanium as main constituents, has an aluminum content of greater than or equal to 50 at. %, and comprises a matrix of γ-TiAl and at least one phase of Al and Ti incorporated in the γ-TiAl matrix which is different from γ-TiAl and comprises Al and Ti, as well as depositions of oxides and/or carbides and/or silicides.

2. The TiAl alloy of claim 1, wherein the alloy comprises up to 75 at. % of aluminum.

3. The TiAl alloy of claim 1, wherein the alloy comprises up to 65 at. % of aluminum.

4. The TiAl alloy of claim 1, wherein the alloy comprises up to 60 at. % of aluminum.

5. The TiAl alloy of claim 1, wherein the γ-TiAl matrix occupies at least 50 vol. % of a microstructure of the alloy.

6. The TiAl alloy of claim 1, wherein the γ-TiAl matrix has a closed or net-like or globular structure.

7. The TiAl alloy of claim 1, wherein the phases of Al and Ti which are different from γ-TiAl comprise β-phase and/or one or more Al-rich intermetallic phases.

8. The TiAl alloy of claim 7, wherein the Al-rich intermetallic phases comprise at least one of $Al_3Ti$ and $Al_2Ti$.

9. The TiAl alloy of claim 1, wherein the depositions comprise at least $ZrO_2$ and/or $Y_2O_3$.

10. The TiAl alloy of claim 1, wherein the alloy comprises one or more of Nb, Mo, W, Co, Cr, V, Zr, Si, C, Er, Gd, Hf, Y, B.

11. The TiAl alloy of claim 1, wherein the alloy comprises the following elements in the indicated percentages:

| W | from 0 to 3 at. % |
| Si | from 0.2 to 0.35 at. % |
| C | from 0 to 0.6 at. % |
| Zr | from 0 to 6 at. % |
| Y | from 0 to 0.5 at. % |
| Hf | from 0 to 0.3 at. % |
| Er | from 0 to 0.5 at. % |
| Gd | from 0 to 0.5 at. % |
| B | from 0 to 0.2 at. %. |

12. The TiAl alloy of claim 1, wherein the alloy comprises the following elements in the indicated percentages:

| Nb | from 4 to 25 at. % | and/or |
| Mo | from 1 to 10 at. % | and/or |
| W | from 0.5 to 3.0 at. % | and/or |
| Co | from 0.1 to 10 at. % | and/or |
| Cr | from 0.5 to 3.0 at. % | and/or |
| V | from 0.5 to 10.0 at. %. | |

13. A method for producing the TiAl alloy of claim 1 or a component produced from the alloy, wherein the method comprises
(i) producing the alloy by melt metallurgy and drawing it in monocrystalline form or casting it in polycrystalline form, or
(ii) producing the alloy at least partially by powder metallurgy.

14. The method of claim 13, wherein according to (ii) at least portions of alloying constituents are alloyed mechanically.

15. The method of claim 13, wherein the alloy is melted by arc melting in vacuo or under a protective gas atmosphere and/or is cast by centrifugal casting.

16. The method of claim 13, wherein the alloy is subjected to hot isostatic pressing and/or isothermal forging after it has been cast or produced by powder metallurgy.

17. The method of claim 13, wherein the method further comprises subjecting the alloy and/or a component produced from the alloy to a single- or multi-step heat treatment.

18. A component of a turbomachine, wherein the component comprises the alloy of claim 1.

19. The component of claim 18, wherein the component is an aircraft engine.

* * * * *